United States Patent
Ishii et al.

(10) Patent No.: US 7,606,018 B2
(45) Date of Patent: *Oct. 20, 2009

(54) SURGE ABSORBING CIRCUIT

(75) Inventors: Koichi Ishii, Tokyo (JP); Yuji Terada, Tokyo (JP); Takeshi Yanata, Tokyo (JP)

(73) Assignee: TDK Corporation, Tokyo (JP)

( * ) Notice: Subject to any disclaimer, the term of this patent is extended or adjusted under 35 U.S.C. 154(b) by 86 days.

This patent is subject to a terminal disclaimer.

(21) Appl. No.: 11/488,660

(22) Filed: Jul. 19, 2006

(65) Prior Publication Data

US 2007/0019353 A1    Jan. 25, 2007

(30) Foreign Application Priority Data

Jul. 25, 2005    (JP) .............................. P2005-214837

(51) Int. Cl.
*H02H 1/04* (2006.01)
*H01F 5/04* (2006.01)
*H01F 27/28* (2006.01)

(52) U.S. Cl. ..................... 361/127; 336/200; 336/223

(58) Field of Classification Search ................. 361/127; 336/200, 223
See application file for complete search history.

(56) References Cited

U.S. PATENT DOCUMENTS

| | | | | |
|---|---|---|---|---|
| 5,004,317 A | * | 4/1991 | Jackson et al. | 385/38 |
| 5,977,845 A | * | 11/1999 | Kitahara | 333/184 |
| 6,759,937 B2 | * | 7/2004 | Kyriazidou | 336/200 |
| 2006/1003863 | * | 2/2006 | Richiuso et al. | 333/177 |

FOREIGN PATENT DOCUMENTS

| | | | |
|---|---|---|---|
| JP | 3-274815 | * | 12/1991 |
| JP | A 2001-060838 | | 3/2001 |
| TW | 450477 | | 8/2001 |

\* cited by examiner

*Primary Examiner*—Stephen W Jackson
*Assistant Examiner*—Zeev Kitov
(74) *Attorney, Agent, or Firm*—Oliff & Berridge, PLC

(57) ABSTRACT

A surge absorbing circuit has a substrate on which a first conductor, a second conductor, and a third conductor are placed, and a surge absorber having a first terminal and a second terminal. The first conductor and the second conductor are mutually coupled in a polarity-reversed relation. One end of the first conductor is connected to one end of the second conductor. The third conductor is electrically isolated from the first conductor and the second conductor on the substrate. The first terminal of the surge absorber is connected to a connection portion between the first conductor and the second conductor. The second terminal of the surge absorber is connected to the third conductor.

10 Claims, 12 Drawing Sheets

SURGE ABSORBING CIRCUIT

BACKGROUND OF THE INVENTION

1. Field of the Invention

The present invention relates to a surge absorbing circuit.

2. Related Background of the Invention

Semiconductor devices such as ICs and LSIs can be broken or deteriorated in characteristics by static electricity of high voltage. For this reason, the semiconductor devices are constructed using a surge absorber, such as a varistor, as a countermeasure against static electricity.

The surge absorbers including the varistors have a stray capacitance component and a stray inductance component. Therefore, if a surge absorber is applied to a circuit handling high-speed signals, the high-speed signals will be deteriorated by influence of the surge absorber. The stray capacitance component of the surge absorber must be kept small for avoiding deterioration of rising characteristics and delay characteristics of the high-speed signals. However, decrease of the stray capacitance component of the surge absorber will result in increase of control voltage of the surge absorber and decrease of energy resistance of the surge absorber.

A surge absorber provided with an inductor and two varistors is known as a surge absorber for alleviating the influence of the stray capacitance component (e.g., Japanese Patent Application Laid-Open No. 2001-60838). The surge absorber described in the Laid-Open No. 2001-60838 has a parallel circuit consisting of the first varistor and the inductor, the second varistor electrically connected in series to the parallel circuit, and input/output electrodes and a ground electrode connected to the two ends of the series circuit consisting of the second varistor and the parallel circuit.

SUMMARY OF THE INVENTION

In the surge absorber described in the Laid-Open No. 2001-60838, however, a band-pass filter is constructed of the stray capacitance of the first varistor and the inductor, and it is thus difficult to effect impedance matching over a wide band. Therefore, it is infeasible to achieve sufficient characteristics for high-speed signals.

An object of the present invention is to provide a surge absorbing circuit with excellent impedance matching for high-speed signals as well.

A surge absorbing circuit according to the present invention is a surge absorbing circuit comprising: a substrate on which a first conductor, a second conductor, and a third conductor are placed; and a surge absorber having a first terminal and a second terminal, wherein the first conductor and the second conductor are mutually coupled in a polarity-reversed relation, and one end of the first conductor is connected to one end of the second conductor, wherein the third conductor is electrically isolated from the first conductor and the second conductor on the substrate, and wherein the first terminal of the surge absorber is connected to a connection portion between the first conductor and the second conductor, and the second terminal of the surge absorber is connected to the third conductor.

In the surge absorbing circuit according to the present invention, the first conductor and the second conductor mutually coupled in the polarity-reversed relation are placed on the substrate. For this reason, the influence of the stray capacitance component can be canceled by properly setting the induction coefficient of the first conductor and the second conductor relative to the stray capacitance component of the surge absorber. As a result, the input impedance with a flat frequency characteristic can be realized over a wide band.

Preferably, the surge absorber is a multilayer chip varistor.

Preferably, the first conductor and the second conductor are placed on an identical layer. In this case, the first conductor and the second conductor are readily formed, whereby the surge absorbing circuit can be readily produced.

Preferably, the first conductor and the second conductor are placed on different layers so that at least partial regions of the first conductor and the second conductor overlap each other, and the mutually overlapping regions of the first conductor and the second conductor constitute a capacitance component. This permits us to flexibly set the induction coefficient of the first conductor and the second conductor, and the capacitance of the capacitance component of the mutually overlapping regions relative to the stray capacitance component of the surge absorber. Since the first conductor and the second conductor constitute the capacitance component, there is no need for separately providing a capacitor element, which can simplify the configuration of the circuit and achieve downsizing of the circuit.

Preferably, the mutually overlapping regions of the first conductor and the second conductor are wider than regions except for the mutually overlapping regions. This configuration permits us to set the capacitance of the capacitance component of the mutually overlapping regions to a more appropriate value.

Preferably, a signal is inputted into the first conductor and a signal is outputted from the second conductor, and the first conductor and the second conductor are positively coupled.

The present invention successfully provides the surge absorbing circuit with excellent impedance matching for high-speed signals as well.

DESCRIPTION OF THE PREFERRED EMBODIMENTS

The preferred embodiments of the present invention will be described below in detail with reference to the accompanying drawings. In the description the same elements or elements with the same functionality will be denoted by the same reference symbols, without redundant description.

First Embodiment

Figure 1:
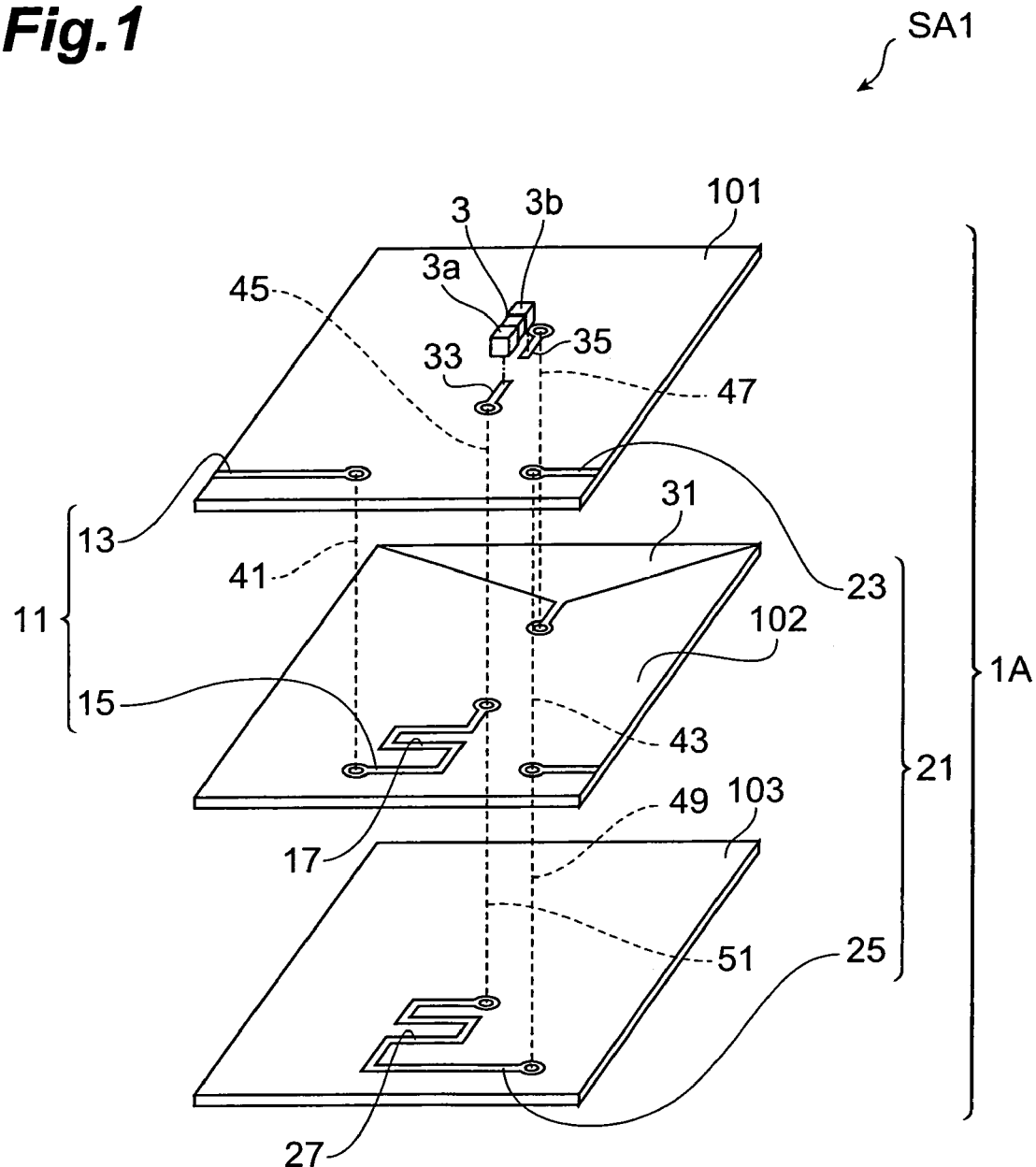
FIG. 1 is an exploded perspective view for explaining a configuration of a surge absorbing circuit according to the first embodiment.

First, a configuration of a surge absorbing circuit SA1 according to the first embodiment will be described based on FIG. 1. FIG. 1 is an exploded perspective view for explaining the configuration of the surge absorbing circuit SA1 according to the first embodiment.

The surge absorbing circuit SA1 has a multilayer circuit substrate 1A on which predetermined circuit patterns are formed, and a surge absorber 3. In the circuit substrate 1A, three layers of insulating layers 101 to 103 are stacked in order.

The circuit substrate 1A is provided with a first conductor 11, a second conductor 21, a third conductor 31, a first land 33, and a second land 35 arranged thereon. The first conductor 11 includes a first portion 13 and a second portion 15. The second conductor 21 includes a first portion 23 and a second portion 25. In the surge absorbing circuit SA1, a signal is inputted into the first conductor 11, and a signal is outputted from the second conductor 21.

The first portion 13 of the first conductor 11, the first portion 23 of the second conductor 21, the first land 33, and the second land 35 are placed in a mutually electrically isolated state on the insulating layer 101. The first portion 13 is a pattern of a straight shape. One end of the first portion 13 is electrically connected to a transmission line for inputting a signal into the surge absorbing circuit SA1. The insulating layer 101 is provided with a through-hole conductor 41 penetrating the insulating layer 101 in the thickness direction thereof, at a position corresponding to the other end of the first portion 13. The through-hole conductor 41 is electrically connected to the first portion 13. The first portion 23 is a pattern of a straight shape. One end of the first portion 23 is electrically connected to a transmission line for outputting a signal from the surge absorbing circuit SA1. The insulating layer 101 is provided with a through-hole conductor 43 penetrating the insulating layer 101 in the thickness direction thereof, at a position corresponding to the other end of the first portion 23. The through-hole conductor 43 is electrically connected to the first portion 23.

The surge absorber 3 is mounted (e.g., fillet-mounted) on the circuit substrate 1A, and the surge absorber 3 is placed on the insulating layer 101. In the present embodiment a multilayer chip varistor is used as the surge absorber 3. The configuration of the multilayer chip varistor is well known, and thus the detailed description thereof is omitted herein, except that the multilayer chip varistor includes at least a pair of internal electrodes, and a varistor layer interposed between the pair of internal electrodes. The varistor layer is comprised of a ceramic material consisting primarily of ZnO. This ceramic material further contains as additives, at least one element selected from the group consisting of Pr and Bi, Co and Al, and so on. Since the varistor layer contains Co in addition to Pr, the varistor has excellent nonlinear voltage-current characteristics, i.e., varistor characteristics. In the multilayer chip varistor the varistor layer has a surge absorbing function.

The surge absorber 3 has a first terminal 3a and a second terminal 3b. The first terminal 3a of the surge absorber 3 is physically and electrically connected to the first land 33. The second terminal 3b of the surge absorber 3 is physically and electrically connected to the second land 35. The first land 33 is electrically connected to a through-hole conductor 45 arranged to penetrate the insulating layer 101 in the thickness direction thereof. The second land 35 is electrically connected to a through-hole conductor 47 arranged to penetrate the insulating layer 101 in the thickness direction thereof.

The second portion 15 of the first conductor 11 is placed on the insulating layer 102. The second portion 15 of the first conductor 11 is of a meander shape. One end of the second portion 15 is located corresponding to the through-hole conductor 41. The second portion 15 is electrically connected to the through-hole conductor 41 in a state in which the insulating layer 101 and the insulating layer 102 are stacked. This causes the first portion 13 and second portion 15 to be electrically connected through the through-hole conductor 41. The other end of the second portion 15 is located corresponding to the through-hole conductor 45. The second portion 15 is electrically connected to the through-hole conductor 45 in the state in which the insulating layer 101 and the insulating layer 102 are stacked. This causes the second portion 15 and surge absorber 3 to be electrically connected through the through-hole conductor 45 and the first land 33.

The third conductor 31 electrically connected to the ground is placed on the insulating layer 102. The third conductor 31 is electrically isolated from the first conductor 11 and the second conductor 21 in a state in which the surge absorber 3 is not mounted. Namely, the third conductor 31 is connected through the surge absorber 3 to the first conductor 11 and the second conductor 21. The third conductor 31 has a region located corresponding to the through-hole conductor 47. The third conductor 31 is electrically connected to the through-hole conductor 47 in the state in which the insulating layer 101 and the insulating layer 102 are stacked. This causes the third conductor 31 and the surge absorber 3 to be electrically connected through the through-hole conductor 47 and the second land 35.

The insulating layer 102 is provided with a through-hole conductor 49 at a position corresponding to the through-hole conductor 43. The through-hole conductor 49 penetrates the insulating layer 102 in the thickness direction thereof. The through-hole conductor 49 is electrically connected to the through-hole conductor 43 in the state in which the insulating layer 101 and the insulating layer 102 are stacked. The insulating layer 102 is also provided with a through-hole conductor 51 at a position corresponding to the through-hole conductor 45. The through-hole conductor 51 penetrates the insulating layer 102 in the thickness direction thereof. The through-hole conductor 51 is electrically connected to the through-hole conductor 45 in the state in which the insulating layer 101 and the insulating layer 102 are stacked.

The second portion 25 of the second conductor 21 is placed corresponding to the second portion 15 of the first conductor 11, on the insulating layer 103. The second portion 25 of the second conductor 21 is of a meander shape. One end of the second portion 25 is located corresponding to the through-hole conductor 49. The second portion 25 is electrically connected to the through-hole conductor 49 in the state in which the insulating layer 102 and the insulating layer 103 are stacked. This causes the first portion 23 and the second portion 25 to be electrically connected through the through-hole conductors 43, 49. The other end of the second portion 25 is located corresponding to the through-hole conductor 51. The second portion 25 is electrically connected to the through-hole conductor 51 in the state in which the insulating layer 102 and the insulating layer 103 are stacked. This causes the second portion 25 and the surge absorber 3 to be electrically connected through the through-hole conductors 45, 51 and the first land 33.

In the above-described surge absorbing circuit SA1, the second portion 15 of the first conductor 11 and the second portion 25 of the second conductor 21 include their respective regions 17, 27 mutually coupled in a polarity-reversed relation. The region 17 of the second portion 15 and the region 27 of the second portion 25 are located so as to overlap each other when viewed from the stack direction of the insulating layers 102, 103.

Figure 2:
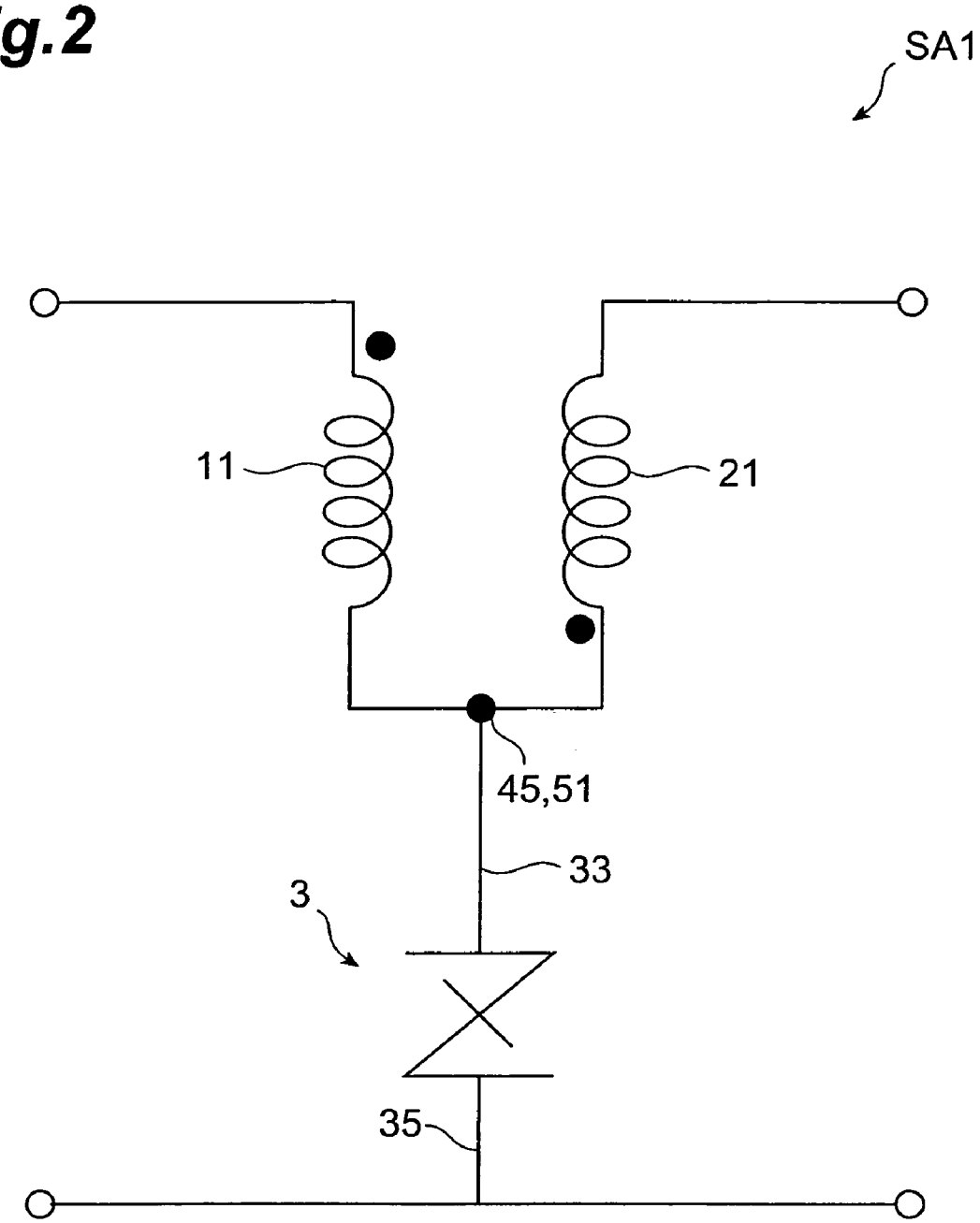
FIG. 2 is a circuit diagram for explaining a circuit configuration of the surge absorbing circuit according to the first embodiment.
Figure 3:
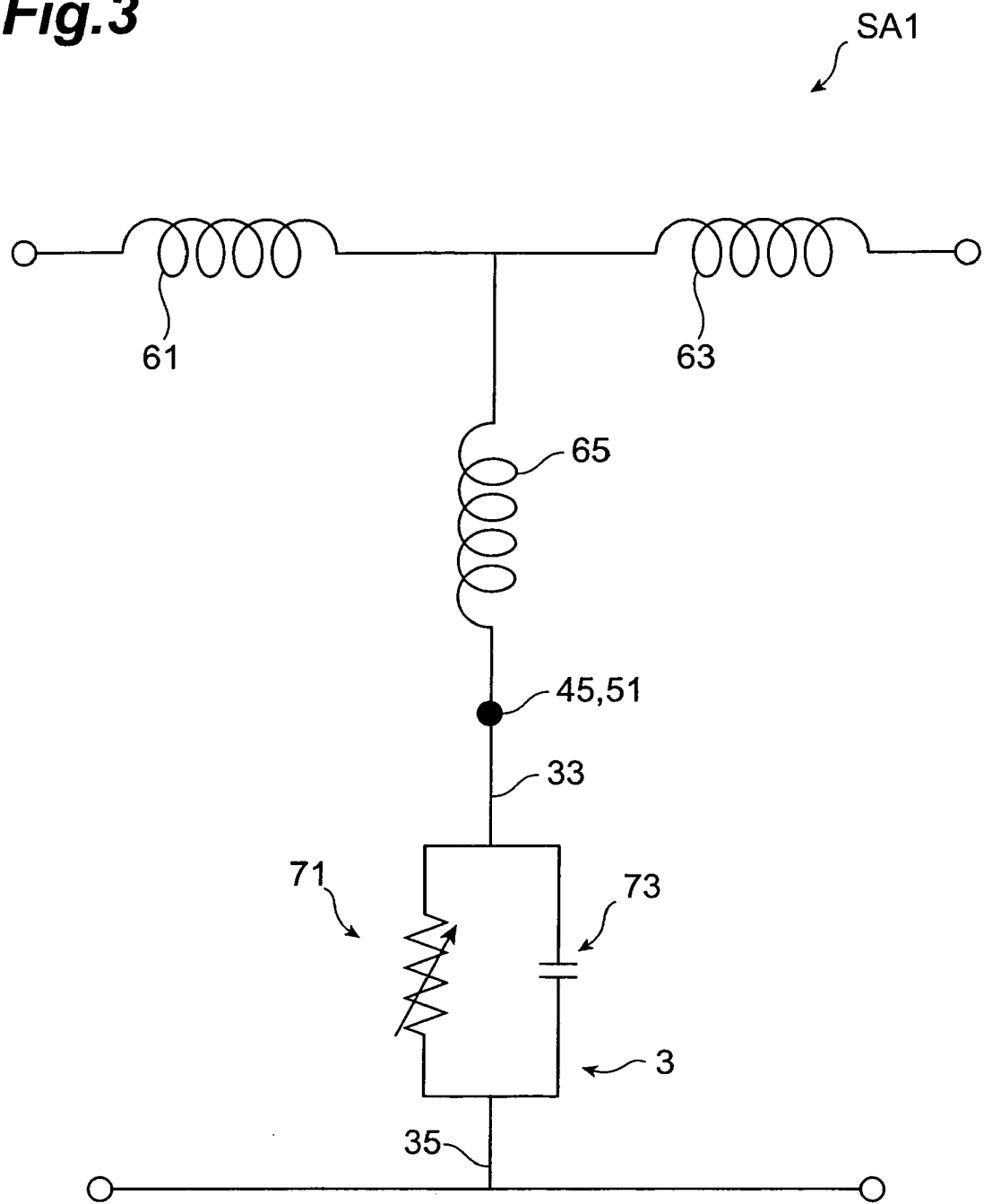
FIG. 3 is a circuit diagram showing an equivalent circuit to the circuit configuration shown in FIG. 2.

The circuit configuration of the above-described surge absorbing circuit SA1 will be described below based on FIGS. 2 and 3. FIG. 2 is a diagram for explaining the circuit configuration of the surge absorbing circuit SA1 according to the first embodiment. FIG. 3 is a diagram showing an equivalent circuit to the circuit configuration shown in FIG. 2.

As shown in FIG. 2, one end of the first conductor 11 having an inductance component is electrically connected to one end of the second conductor 21 having an inductance component. As described above, the first conductor 11 (region 17 of the second portion 15) and the second conductor 21 (region 27 of the second portion 25) are mutually coupled in the polarity-reversed relation. The first terminal 3a of the surge absorber 3 is electrically connected to a connection portion (the through-hole conductors 45, 51 in the present embodiment) between the first conductor 11 and the second conductor 21. The second terminal 3b of the surge absorber 3 is electrically connected to the third conductor 31.

Here the state of being "coupled in a polarity-reversed relation" means that, in a case where the winding start of the inductance component corresponding to the first conductor 11 is located on the signal input side and where the winding start of the inductance component corresponding to the second conductor 21 is located on the connected side to the first conductor 11 (the through-hole conductor 51 side in the present embodiment), as shown in FIG. 2, the coupling between the first conductor 11 and the second conductor 21 is "positive." Namely, the state of being "coupled in a polarity-reversed relation" means that an electric current flows from the first portion 13 side of the first conductor 11 into the second portion 15, an electric current flows from the connected side to the first internal conductor 11 (the through-hole conductor 51 side in the present embodiment) into the second conductor 21, and a magnetic flux produced in the first conductor 11 and a magnetic flux produced in the second conductor 21 reinforce each other.

The first conductor 11 and the second conductor 21 coupled in the polarity-reversed relation can be transformed into a first inductance component 61, a second inductance component 63, and a third inductance component 65, as shown in FIG. 3. The first inductance component 61 and the second inductance component 63 are connected in series. The third inductance component 65 is connected between a connection portion between the first inductance component 61 and the second inductance component 63 connected in series, and the surge absorber 3. Let Lz be the induction coefficient of the first conductor 11 and the second conductor 21, and Kz be the coupling coefficient between the first conductor 11 and the second conductor 21, and then the induction coefficient of the first inductance component 61 and the second inductance component 63 is given by $(1+Kz)Lz$ and the induction coefficient of the third inductance component 65 by $-KzLz$.

The surge absorber 3 can be transformed into a variable resistor 71 and a stray capacitance component 73 connected in parallel between the third inductance component 65 and the third conductor 31, as shown in FIG. 3. The variable resistor 71 usually has a large resistance and decreases the resistance with application of a high voltage surge. The surge absorber 3 can be approximated by only the stray capacitance component 73 for high-speed signals of small amplitude.

The input impedance Zin of the surge absorbing circuit SA1 shown in FIG. 3 is represented by Eq (1) below. In this equation the capacitance of the stray capacitance component 73 of the surge absorber 3 is represented by Cz.

$$Zin = \sqrt{\frac{2(1+Kz)Lz}{Cz} + \omega^2 Lz^2(Kz^2-1)} \quad (1)$$

In Eq (1), if the coupling coefficient Kz is set to satisfy $Kz=\pm1$, the input impedance Zin becomes independent of frequency characteristics. However, the case of $Kz=-1$ is not appropriate because the input impedance $Zin=0$. Therefore, by setting $Kz=1$ and the induction coefficient Lz as represented by Eq (2) below, the input impedance Zin can be matched with the characteristic impedance Zo.

$$Lz = \frac{Zo^2 Cz}{4} \quad (2)$$

In the first embodiment, as described above, the first conductor 11 and the second conductor 21 mutually coupled in the polarity-reversed relation are placed on the circuit substrate 1A. For this reason, when the induction coefficient of the first conductor 11 and the second conductor 21 is properly set relative to the stray capacitance component of the surge absorber 3, it becomes feasible to cancel the influence of the stray capacitance component. As a result, it is feasible to substantialize the input impedance with flat frequency characteristics over a wide band.

Incidentally, the circuit configuration shown in FIG. 3 can also be substantialized by a multilayer electronic component (multilayer surge absorbing component). In this case, the multilayer surge absorbing component comprises a laminate including internal conductors corresponding to the first conductor and the second conductor, and a surge absorber. However, since the configuration wherein the internal conductors corresponding to the first conductor and the second conductor are included in the laminate imposes restrictions on a material forming the laminate (usually, a ceramic material) and on a material forming the internal electrodes, a large loss occurs in the internal conductors corresponding to the first conductor and the second conductor, as described below. Since the laminate needs to include the surge absorber, the material forming the laminate comes to have a relatively large permittivity. For this reason, the stray capacitance becomes large between the internal conductor corresponding to the first conductor and the internal conductor corresponding to the second conductor, and it becomes necessary to lengthen the internal conductors corresponding to the first conductor and the second conductor in correspondence to the stray capacitance. This results in increasing the loss in the internal conductors corresponding to the first conductor and the second conductor.

When the size of the laminate is small, it is difficult to secure the length of the internal conductors corresponding to the first conductor and the second conductor, at a desired value. This could result in making it difficult to achieve a sufficient induction coefficient. Where the internal conductors are laid out within a narrow region, the internal conductors can possibly be formed in a meander shape or the like. However, folded portions of the internal conductors come to be located close to each other, so as to produce a new stray capacitance. For this reason, the length of the internal conductors corresponding to the first conductor and the second conductor becomes needed to be further lengthened, which could result in making the layout itself hard. Furthermore, it usually becomes necessary to perform simultaneous firing of the internal conductors with the ceramic material, and there are restrictions on the material in order to prevent reaction with the ceramic material, which could increase the loss in the internal conductors.

In contrast to it, since in the first embodiment the first conductor 11 and the second conductor 21 are placed on the circuit substrate 1A and constructed separately from the surge absorber 3, the first embodiment is free of the problem arising in the case of the above-described multilayer surge absorbing component. Namely, it is feasible to suppress occurrence of loss in the first conductor 11 and the second conductor 21 and to readily secure a sufficient induction coefficient.

Therefore, the surge absorbing circuit SA1 of the first embodiment can serve as a surge absorbing circuit that protects a semiconductor device or the like from static electricity of high voltage and that achieves better impedance matching for high-speed signals as well.

Modification Examples of the First Embodiment

Modification examples of the surge absorbing circuit SA1 according to the above first embodiment will be described below. Surge absorbing circuits SA2, SA3 according to the modification examples are different in the configurations of the first conductor 11 and the second conductor 21 and others from the surge absorbing circuit SA1 of the first embodiment.

Figure 4:
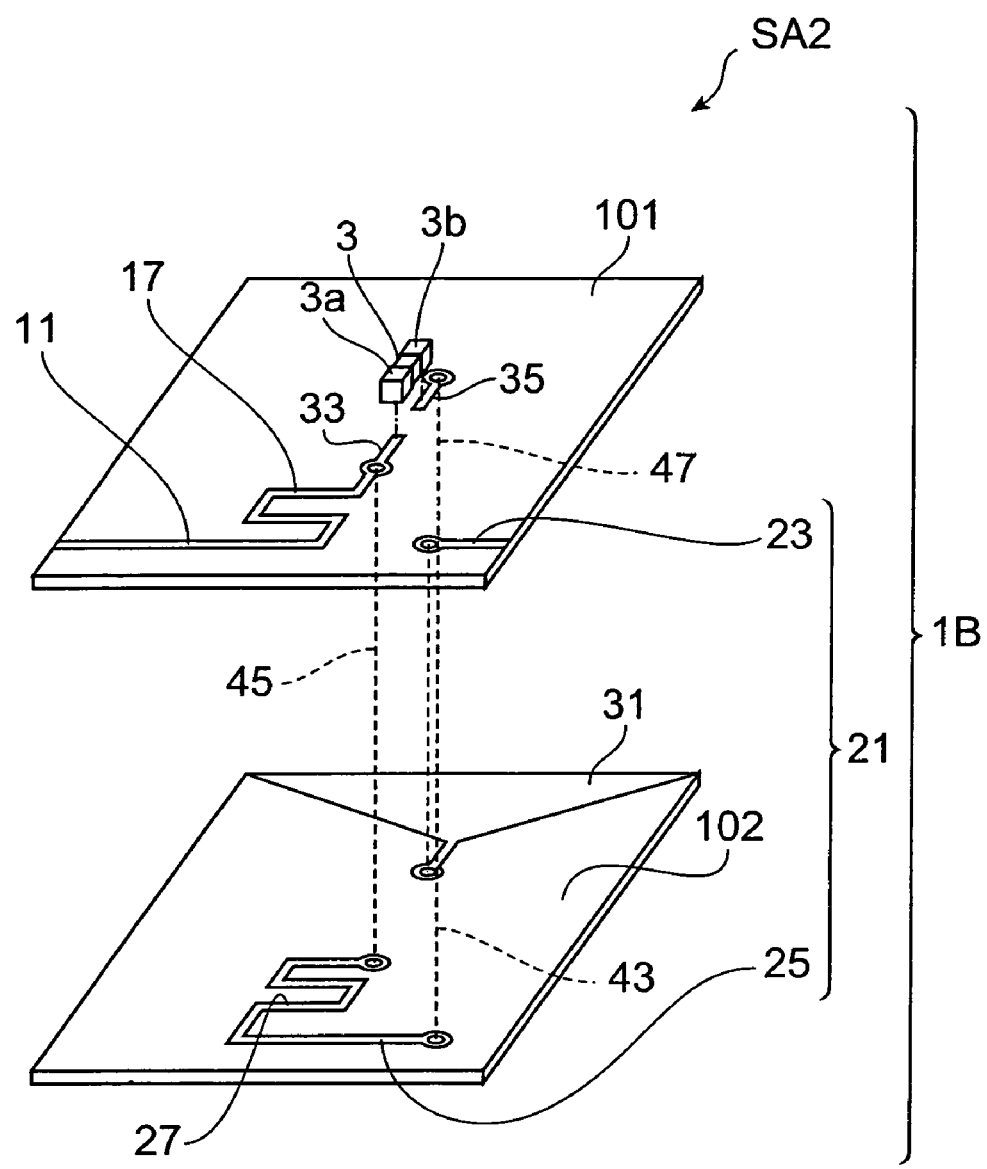
FIG. 4 is an exploded perspective view for explaining a configuration of a surge absorbing circuit which is a first modification example of the first embodiment.

First, the first modification example of the surge absorbing circuit SA1 according to the first embodiment will be described with reference to FIG. 4. FIG. 4 is an exploded perspective view for explaining the configuration of the surge absorbing circuit SA2 being the first modification example of the first embodiment.

The surge absorbing circuit SA2 has a multilayer circuit substrate 1B on which predetermined circuit patterns are formed, and a surge absorber 3. In the circuit substrate 1B, two layers of insulating layers 101, 102 are stacked in order. The circuit substrate 1B, similar to the circuit substrate 1A, is provided with a first conductor 11, a second conductor 21, a third conductor 31, a first land 33, and a second land 35 arranged thereon. The surge absorber 3 is mounted on the circuit substrate 1B. An equivalent circuit configuration of the surge absorbing circuit SA2 is the same as that of the surge absorbing circuit SA1 shown in FIGS. 2 and 3.

The first conductor 11 and first land 33 are placed on the insulating layer 101. The first conductor 11 and the first land 33 are formed integrally with each other. The first conductor 11 is of a meander shape. The insulating layer 101 is provided with a through-hole conductor 45 penetrating the insulating layer 101 in the thickness direction thereof, at a position corresponding to an end of the first conductor 11 on the first land 33 side. The through-hole conductor 45 is electrically connected to the first conductor 11 and the first land 33. The second land 35 is electrically connected through the through-hole conductor 47 to the third conductor 31, as in the first embodiment described above.

The second portion 25 of the second conductor 21 is placed on the insulating layer 102. The second portion 25 is of a meander shape, corresponding to the first conductor 11. One end of the second portion 25 is located corresponding to the through-hole conductor 43 and electrically connected to the through-hole conductor 43 in the state in which the insulating layer 101 and the insulating layer 102 are stacked. Therefore, the first portion 23 and the second portion 25 are electrically connected through the through-hole conductor 43. The other end of the second portion 25 is located corresponding to the through-hole conductor 45 and is electrically connected to the through-hole conductor 45 in the state in which the insulating layer 101 and the insulating layer 102 are stacked. Therefore, the first conductor 11 and the second portion 25 are electrically connected through the through-hole conductor 45. The second portion 25 and the surge absorber 3 are electrically connected through the through-hole conductor 45 and the first land 33.

The third conductor 31 is placed on the insulating layer 102. The third conductor 31 and the surge absorber 3 are electrically connected through the through-hole conductor 47 and the second land 35, as in the above first embodiment.

In the surge absorbing circuit SA2 having the above-described configuration, the first conductor 11 and the second portion 25 of the second conductor 21 also include their respective regions 17, 27 mutually coupled in a polarity-reversed relation. The region 17 of the first conductor 11 and the region 27 of the second portion 25 are located so as to overlap each other when viewed from the stack direction of the insulating layers 101, 102.

As described above, the surge absorbing circuit SA2 can serve as a surge absorbing circuit that protects a semiconductor device or the like from static electricity of high voltage and that achieves better impedance matching for high-speed signals as well, as the surge absorbing circuit SA1 can.

Figure 5:
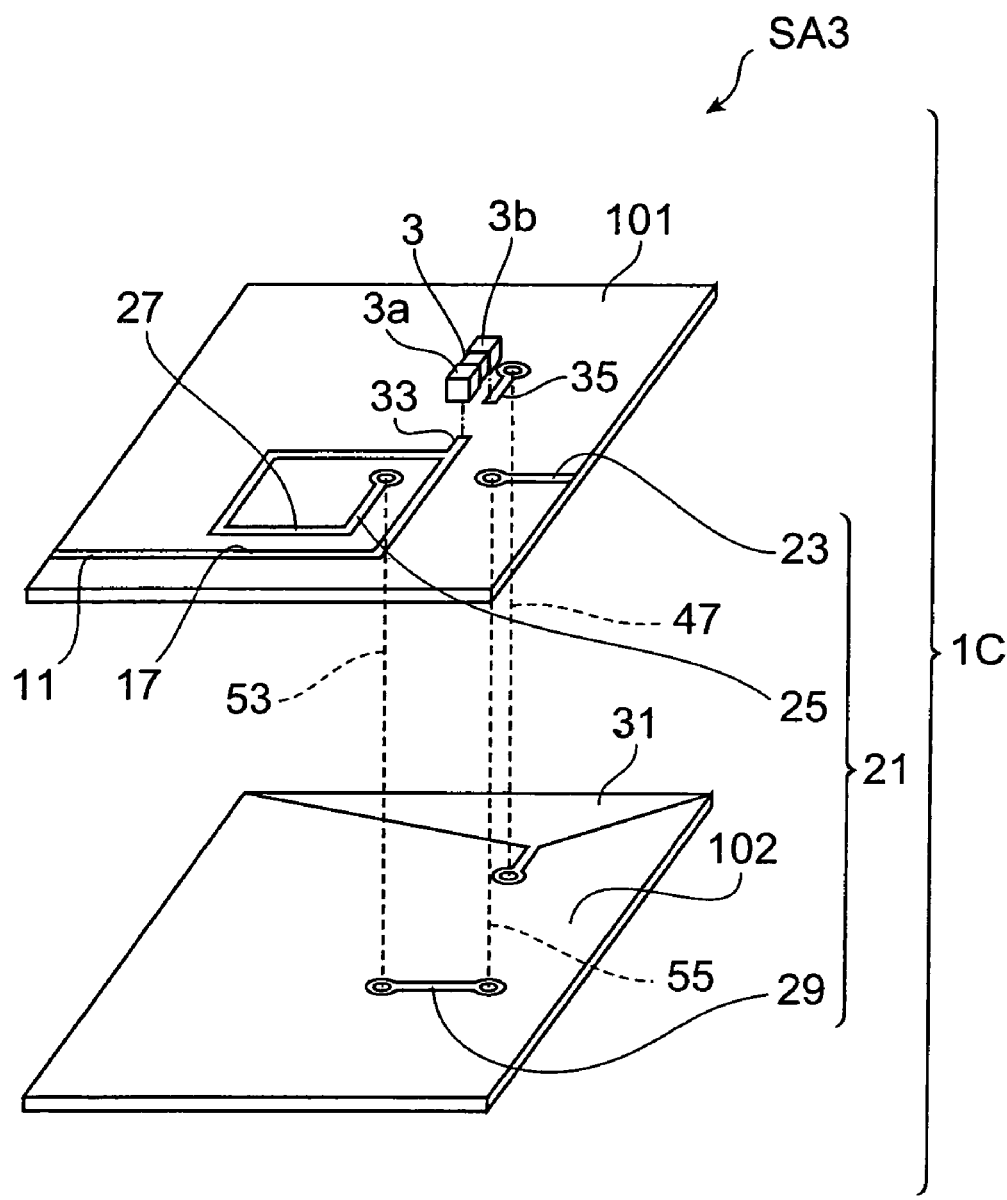
FIG. 5 is an exploded perspective view for explaining a configuration of a surge absorbing circuit which is a second modification example of the first embodiment.

Next, the second modification example of the surge absorbing circuit SA1 according to the first embodiment will be described with reference to FIG. 5. FIG. 5 is an exploded perspective view for explaining the configuration of the surge absorbing circuit SA3 being the second modification example of the first embodiment.

The surge absorbing circuit SA3 has a multilayer circuit substrate 1C on which predetermined circuit patterns are formed, and a surge absorber 3. In the circuit substrate 1C, two layers of insulating layers 101, 102 are stacked in order. The circuit substrate 1C is provided with a first conductor 11, a second conductor 21, a third conductor 31, a first land 33, and a second land 35 arranged thereon. The surge absorber 3 is mounted on the circuit substrate 1C. The second conductor 21 includes a first portion 23, a second portion 25, and a third portion 29. An equivalent circuit configuration of the surge absorbing circuit SA3 is the same as that of the surge absorbing circuit SA1 shown in FIGS. 2 and 3.

The first conductor 11, the first land 33, and the second portion 25 of the second conductor 21 are placed on the insulating layer 101. This results in placing the first conductor 11 and the second portion 25 of the second conductor 21 on an identical layer. The first conductor 11, the first land 33, and the second portion 25 of the second conductor 21 are formed integrally with each other. The first conductor 11 and the second portion 25 of the second conductor 21 include their respective regions 17, 27 mutually coupled in a polarity-reversed relation. The region 17 of the first conductor 11 and the region 27 of the second portion 25 are arranged with a predetermined clearance and along each other in a predetermined direction perpendicular to the stack direction of the insulating layers 101, 102.

The insulating layer 101 is provided with a through-hole conductor 53 penetrating the insulating layer 101 in the thickness direction thereof, at a position corresponding to an end of the second portion 25 (an end opposite to an end continuous to the first conductor 11 and the first land 33). The through-hole conductor 53 is electrically connected to the second portion 25. The first portion 23 of the second conductor 21 is placed on the insulating layer 101 in a state in which it is electrically isolated from the second portion 25. The insulating layer 101 is provided with a through-hole conductor 55 penetrating the insulating layer 101 in the thickness direction thereof. The through-hole conductor 55 is electrically connected to the first portion 23.

The third portion 29 of the second conductor 21, and the third conductor 31 are placed on the insulating layer 102. The third portion 29 is a pattern of a straight shape. One end of the third portion 29 is located corresponding to the through-hole conductor 53 and is electrically connected to the through-hole conductor 53 in the state in which the insulating layer 101 and the insulating layer 102 are stacked. The other end of the third portion 29 is located corresponding to the through-hole conductor 55 and is electrically connected to the through-hole conductor 55 in the state in which the insulating layer 101 and the insulating layer 102 are stacked. Therefore, the third portion 29 is electrically connected to the first portion 23 and the second portion 25.

As described above, the surge absorbing circuit SA3 can serve as a surge absorbing circuit that protects a semiconductor device or the like from static electricity of high voltage and that achieves better impedance matching for high-speed signals as well, as the aforementioned surge absorbing circuit SA1 can.

Second Embodiment

Figure 6:
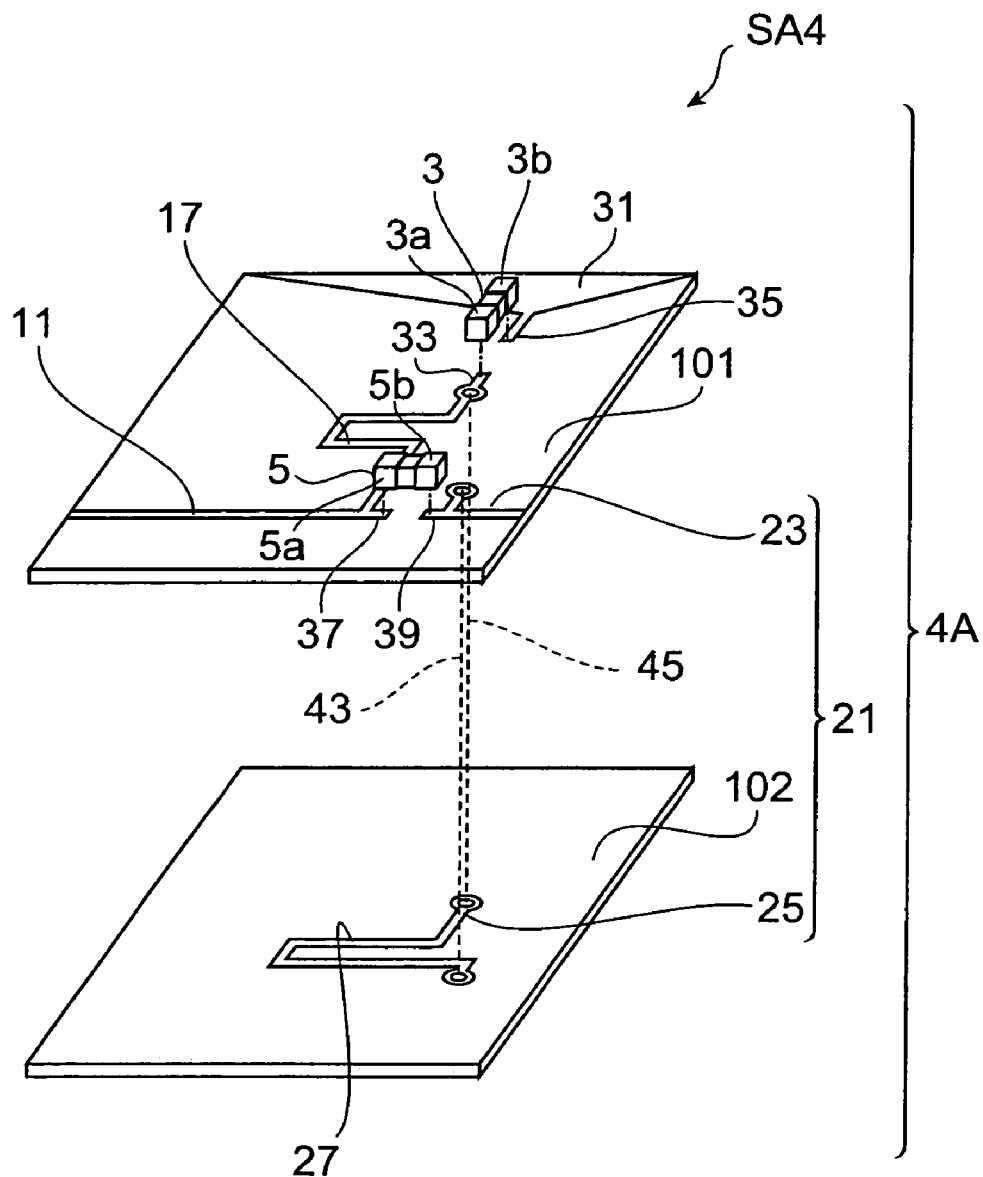
FIG. 6 is an exploded perspective view for explaining a configuration of a surge absorbing circuit according to the second embodiment.

Next, a configuration of a surge absorbing circuit SA4 according to the second embodiment will be described based on FIG. 6. FIG. 6 is an exploded perspective view for explaining the configuration of the surge absorbing circuit SA4 according to the second embodiment. The surge absorbing circuit SA4 is different in inclusion of a capacitor element 5 having a capacitance component, from the surge absorbing circuit SA1.

The surge absorbing circuit SA4 has a circuit substrate 4A on which predetermined circuit patterns are formed, and a surge absorber 3 as the surge absorbing circuit SA1 did, and the surge absorbing circuit SA4 further has a capacitor element 5. In the circuit substrate 4A, two layers of insulating layers 101, 102 are stacked in order. The circuit substrate 4A is provided with a first conductor 11, a second conductor 21, a third conductor 31, a first land 33, a second land 35, a third land 37, and a fourth land 39 arranged thereon. The surge absorber 3 and the capacitor element 5 are mounted on the circuit substrate 4A. The second conductor 21 includes a first portion 23 and a second portion 25.

The first conductor 11, the first land 33, the third land 37, the first portion 23 of the second conductor 21, the fourth land 39, the third conductor 31, and the second land 35 are placed on the insulating layer 101. The first conductor 11, the first land 33, and the third land 37 are formed integrally with each other to constitute one conductor group. The first portion 23 of the second conductor 21 and the fourth land 39 are formed integrally with each other to constitute another conductor group. The third conductor 31 and the second land 35 are formed integrally with each other to constitute still another conductor group. These three conductor groups are electrically isolated from each other. The first conductor 11 is of a meander shape. The first conductor 11 has the third land 37. The third land 37 is formed so as to project toward the first portion 23. The insulating layer 101 is provided with a through-hole conductor 45 penetrating the insulating layer 101 in the thickness direction thereof, at a position corresponding to an end of the first conductor 11 on the first land 33 side. The through-hole conductor 45 is electrically connected to the first conductor 11 and the first land 33.

The first portion 23 has the fourth land 39. The fourth land 39 is formed so as to project toward the first conductor 11. The insulating layer 101 is provided with a through-hole conductor 43 penetrating the insulating layer 101 in the thickness direction thereof. The through-hole conductor 43 is electrically connected to the first portion 23.

The surge absorber 3 is placed on the insulating layer 101. The first terminal 3a of the surge absorber 3 is physically and electrically connected to the first land 33. The second terminal 3b of the surge absorber 3 is physically and electrically connected to the second land 35.

The capacitor element 5 having a capacitance component is placed on the insulating layer 101. The capacitor element 5 is, for example, fillet-mounted on the circuit substrate 4A. The present embodiment uses a multilayer chip varistor as the capacitor element 5. The first terminal 5a of the capacitor element 5 is physically and electrically connected to the third land 37. The second terminal 5b of the capacitor element 5 is physically and electrically connected to the fourth land 39.

The second portion 25 of the second conductor 21 is placed on the insulating layer 102. The second portion 25 is of a meander shape, corresponding to the first conductor 11. One end of the second portion 25 is located corresponding to the through-hole conductor 43, and is electrically connected to the through-hole conductor 43 in the state in which the insulating layer 101 and the insulating layer 102 are stacked. Therefore, the first portion 23 and the second portion 25 are electrically connected through the through-hole conductor 43. The other end of the second portion 25 is located corresponding to the through-hole conductor 45 and is electrically connected to the through-hole conductor 45 in the state in which the insulating layer 101 and the insulating layer 102 are stacked. Therefore, the first conductor 11 and the second portion 25 are electrically connected through the through-hole conductor 45. The second portion 25 and the surge absorber 3 are electrically connected through the through-hole conductor 45 and the first land 33.

In the above-described surge absorbing circuit SA4, the first conductor 11 and the second portion 25 of the second conductor 21 also include their respective regions 17, 27 mutually coupled in a polarity-reversed relation. The region 17 of the first conductor 11 and the region 27 of the second portion 25 are located so as to overlap each other when viewed from the stack direction of the insulating layers 101, 102.

Figure 7:
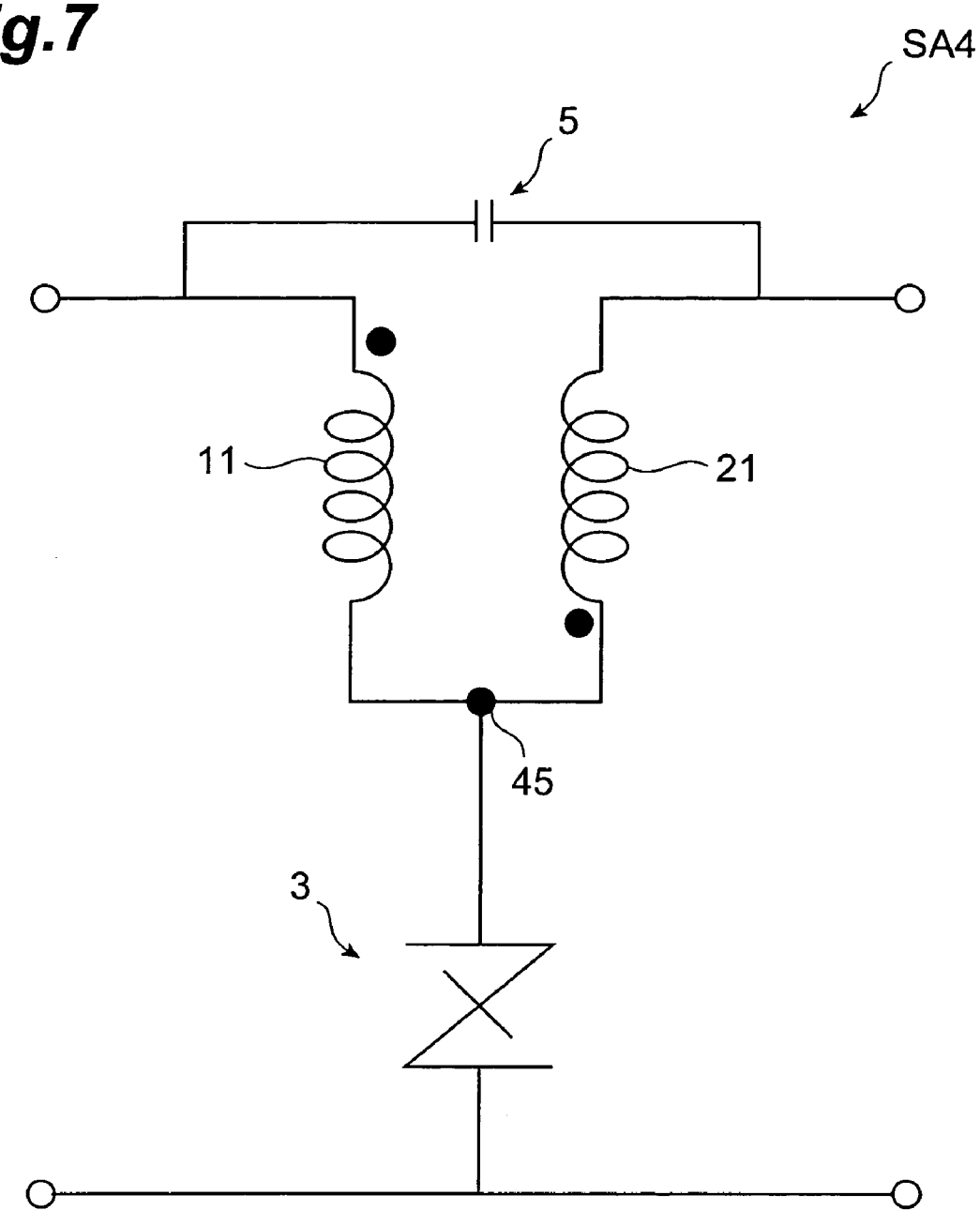
FIG. 7 is a circuit diagram for explaining a circuit configuration of the surge absorbing circuit according to the second embodiment.
Figure 8:
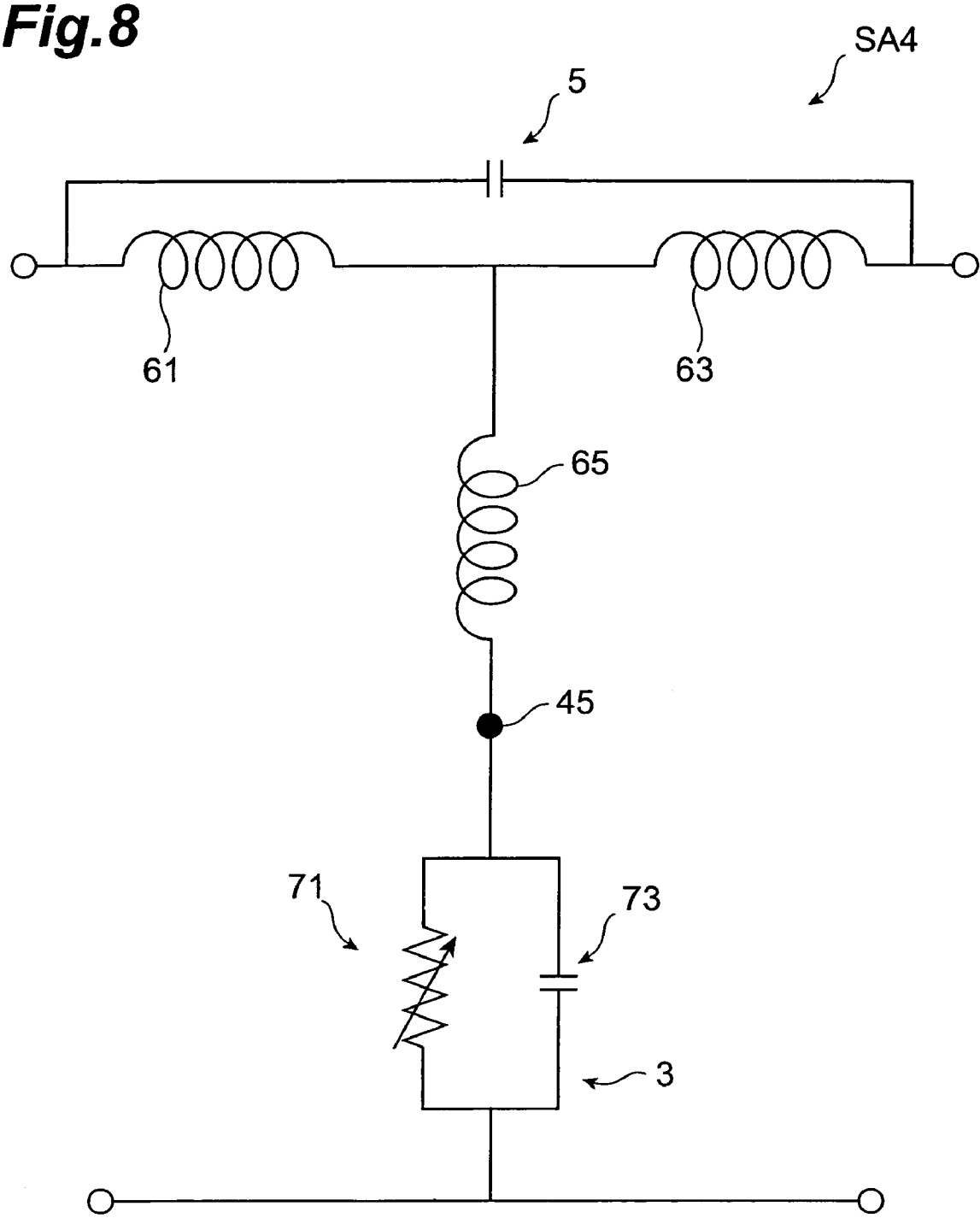
FIG. 8 is a circuit diagram showing an equivalent circuit to the circuit configuration shown in FIG. 7.

Next, the circuit configuration of the surge absorbing circuit SA4 described above will be described based on FIGS. 7 and 8. FIG. 7 is a diagram for explaining the circuit configuration of the surge absorbing circuit SA4 according to the second embodiment. FIG. 8 is a diagram showing an equivalent circuit to the circuit configuration shown in FIG. 7.

As shown in FIG. 7, one end of the first conductor 11 having an inductance component is electrically connected to one end of the second conductor 21 having an inductance component. As described above, the first conductor 11 (region 17) and the second conductor 21 (region 27) are mutually coupled in the polarity-reversed relation. The first terminal 3a of the surge absorber 3 is electrically connected to a connection portion between the first conductor 11 and the second conductor 21. The second terminal 3b of the surge absorber 3 is electrically connected to the third conductor 31. The capacitor element 5 is connected to the first conductor 11 and to the second conductor 21.

As described in the first embodiment, the first conductor 11 and the second conductor 21 mutually coupled in the polarity-reversed relation can be transformed into a first inductance component 61, a second inductance component 63, and a third inductance component 65 (cf. FIG. 8). Let Lz be the induction coefficient of the first conductor 11 and the second conductor 21, and Kz be the coupling coefficient between the first conductor 11 and the second conductor 21, and then the induction coefficient of the first inductance component 61 and the second inductance component 63 is given by (1+Kz)Lz and the induction coefficient of the third inductance component 65 by −KzLz.

The surge absorber 3 can be transformed into a variable resistor 71 and a stray capacitance component 73 connected in parallel between the third inductance component 65 and the third conductor 31, as shown in FIG. 8. As described in the first embodiment, the surge absorber 3 can be approximated by only the stray capacitance component 73 for high-speed signals of small amplitude.

The input impedance Zin of the surge absorbing circuit SA4 shown in FIG. 8 can be represented by Eq (3) below. In this equation, the capacitance of the capacitor element 5 is represented by Cs, and the capacitance of the stray capacitance component 73 of the surge absorber 3 by Cz.

$$Zin = \sqrt{\frac{2(1+Kz)Lz}{Cz} \cdot \frac{1-\omega^2 Lz((1-Kz)Cs/2)}{1-\omega^2 Lz(2(1+Kz)Cs)}} \quad (3)$$

When in Eq (3) the capacitance Cs of the capacitor element 5 is set so as to satisfy Eq (4) below, the input impedance Zin becomes independent of frequency characteristics. By setting the capacitance Cs of the capacitor element 5 as in Eq (4) below and setting the induction coefficient Lz of the first conductor 11 and the second conductor 21 as indicated by Eq (5) below, the input impedance Zin can be matched with the characteristic impedance Zo.

$$Cs = \frac{1-Kz}{4(1+Kz)}Cz \quad (4)$$

$$Lz = \frac{Zo^2 Cz}{2(1+Kz)} \quad (5)$$

As also seen from Eqs (4) and (5) above, the coupling coefficient Kz between the first conductor 11 and the second conductor 21 can be arbitrarily selected, which enables flexible circuit design.

Figure 9:
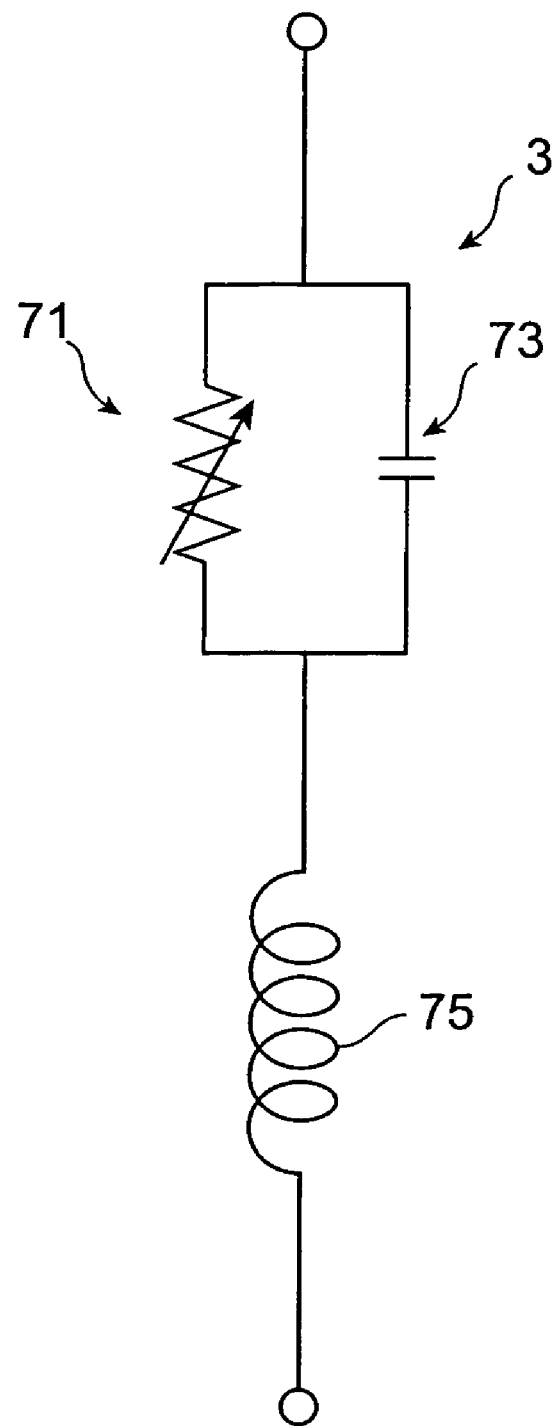
FIG. 9 is a circuit diagram showing an equivalent circuit of a surge absorber.

Incidentally, the surge absorber 3 also includes a stray inductance component 75, as shown in FIG. 9. Usually, the variable resistor 71 has a large resistance and decreases the resistance with application of a high-voltage surge. However, there exist the stray capacitance component 73 and the stray inductance component 75. For this reason, if the surge absorbing circuit SA4 is added to the input side of a semiconductor device handling a high-speed signal as an input signal, it will cause deterioration of the high-speed signal. For applying the surge absorbing circuit SA4 to a circuit handling a high-speed signal, it is preferable to reduce the influence of the stray inductance component 75 as well as the stray capacitance component 73.

As also seen from the equivalent circuit shown in FIG. 8, the stray inductance component 75 of the surge absorber 3 can be canceled by making use of the third inductance component 65 with a negative induction coefficient. However, this is apparently the same as a state in which the coupling becomes smaller, and thus the capacitance Cs of the capacitor element 5 is reduced to Eq (6) below, while maintaining the coupling coefficient Kz and the induction coefficient Lz. In this equation the induction coefficient of the stray inductance component 75 is represented by Le.

$$Cs = \frac{1-Kz+2Le/Lz}{4(1+Kz)}Cz \quad (6)$$

However, KzLz≧Le. When the circuit is designed in this manner, the input impedance Zin can be matched with the characteristic impedance Zo even if the surge absorbing circuit SA4 includes the stray capacitance component 73 and the stray inductance component 75.

In the second embodiment, as described above, it is also feasible to protect a semiconductor device or the like from static electricity of high voltage and to achieve better impedance matching for high-speed signals, as in the first embodiment.

In the second embodiment the surge absorbing circuit SA4 further comprises the capacitor element 5 having the capacitance component. This enables the induction coefficient of the first conductor 11 and the second conductor 21 and the capacitance of the capacitor element 5 to be flexibly set relative to the stray capacitance component 73 of the surge absorber 3.

Modification Examples of the Second Embodiment

Modification examples of the surge absorbing circuit SA4 according to the second embodiment described above will be described below. Surge absorbing circuits SA5, SA6 according to the modification examples are different in the configurations of the first to third conductors 11, 21, 31 and the capacitance component and others from the surge absorbing circuit SA4 of the second embodiment.

Figure 10:
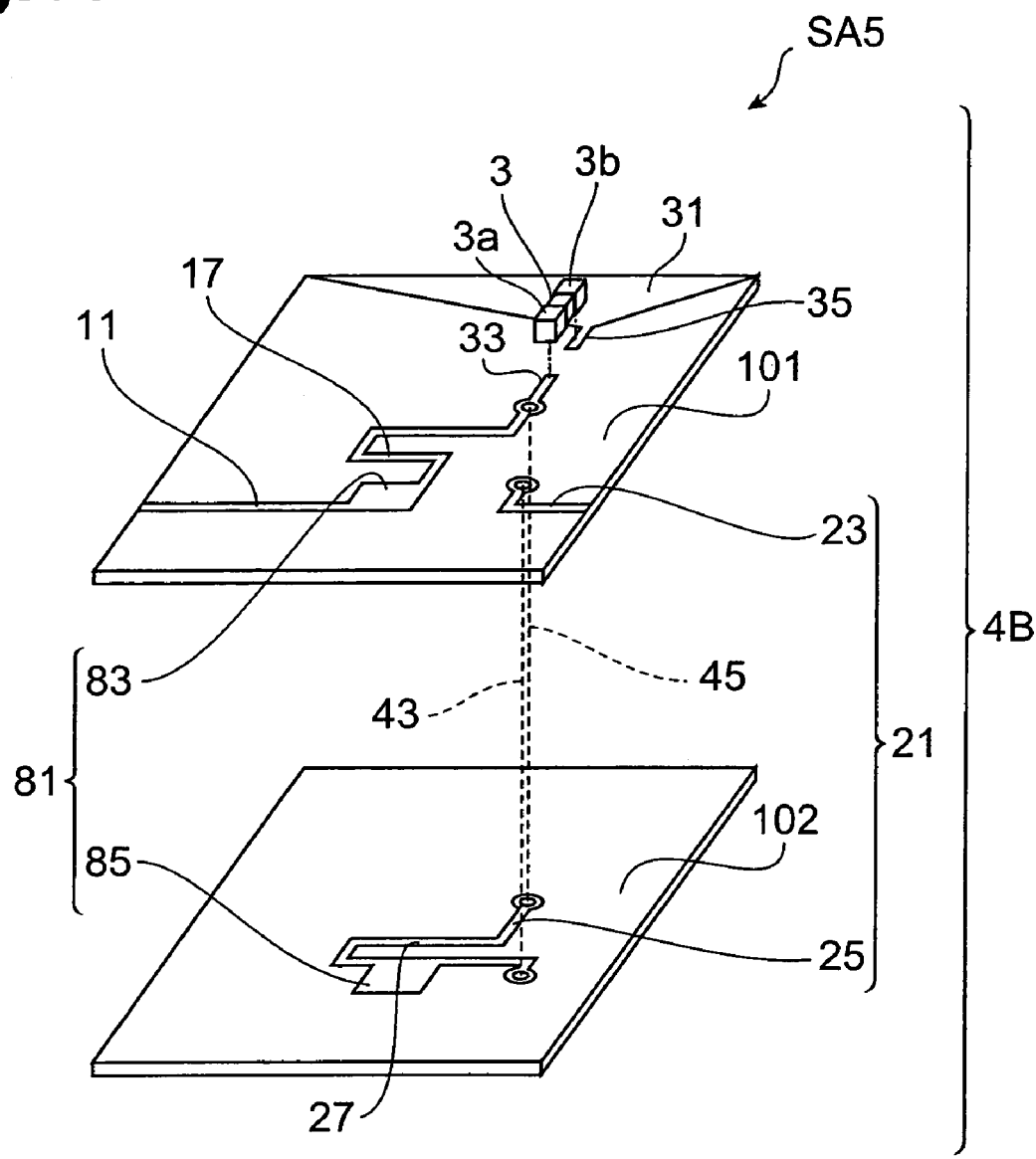
FIG. 10 is an exploded perspective view for explaining a configuration of a surge absorbing circuit which is a first modification example of the second embodiment.

First, the first modification example of the surge absorbing circuit SA4 according to the second embodiment will be described with reference to FIG. 10. FIG. 10 is an exploded perspective view for explaining a configuration of the surge absorbing circuit being the first modification example of the second embodiment. The surge absorbing circuit SA5 is different in inclusion of capacitor part 81 described later, instead of the capacitor element 5 of the surge absorbing circuit SA4, from the surge absorbing circuit SA4.

The surge absorbing circuit SA5 has a multilayer circuit substrate 4B on which predetermined circuit patterns are formed, and a surge absorber 3 as the aforementioned surge absorbing circuit SA4 did. The circuit substrate 4B is provided with a first conductor 11, a second conductor 21, a third conductor 31, a first land 33, and a second land 35 as the circuit substrate 4A was. The surge absorber 3 is mounted on the circuit substrate 4B. The second conductor 21 includes a first portion 23 and a second portion 25.

The first conductor 11, first land 33, first portion 23 of the second conductor 21, third conductor 31, and second land 35 are placed on the insulating layer 101. The first conductor 11 and the first land 33 are formed integrally with each other to constitute one conductor group. The third conductor 31 and the second land 35 are formed integrally with each other to constitute another conductor group. These two conductor groups and the first portion 23 are electrically isolated from each other. The first conductor 11 is of a meander shape. The first conductor 11 includes a region 83. The region 83 is wider than the regions other than the region 83 of the first conductor 11. The insulating layer 101 is provided with a through-hole conductor 45 penetrating the insulating layer 101 in the thickness direction thereof, at a position corresponding to an end of the first conductor 11 on the first land 33 side. The through-hole conductor 45 is electrically connected to the first conductor 11 and the first land 33.

The insulating layer 101 is also provided with a through-hole conductor 43 penetrating the insulating layer 101 in the thickness direction thereof. The through-hole conductor 43 is electrically connected to the first portion 23.

The surge absorber 3 is placed on the insulating layer 101. The first terminal 3a of the surge absorber 3 is physically and electrically connected to the first land 33. The second terminal 3b of the surge absorber 3 is physically and electrically connected to the second land 35.

The second portion 25 of the second conductor 21 is placed on the insulating layer 102. The second portion 25 is of a meander shape, corresponding to the first conductor 11. The second portion 25 of the second conductor 21 includes a region 85 located corresponding to the region 83 of the first conductor 11. The region 85 is wider than the regions other than the region 85 in the second portion 25 of the second conductor 21.

One end of the second portion 25 of the second conductor 21 is located corresponding to the through-hole conductor 43 and is electrically connected to the through-hole conductor 43 in the state in which the insulating layer 101 and the insulating layer 102 are stacked. Therefore, the first portion 23 and the second portion 25 are electrically connected through the through-hole conductor 43. The other end of the second portion 25 is located corresponding to the through-hole conductor 45 and is electrically connected to the through-hole conductor 45 in the state in which the insulating layer 101 and the insulating layer 102 are stacked. Therefore, the first conductor 11 and the second portion 25 are electrically connected through the through-hole conductor 45. In addition, the second portion 25 and the surge absorber 3 are electrically connected through the through-hole conductor 45 and the first land 33.

In the above-described surge absorbing circuit SA5, the first conductor 11, and the second portion 25 of the second conductor 21 also include their respective regions 17, 27 mutually coupled in a polarity-reversed relation. The region 17 of the first conductor 11 and the region 27 of the second portion 25 are located so as to overlap each other when viewed from the stack direction of the insulating layers 101, 102. The region 83 is located on the signal input side with respect to the region 17, and the region 85 is located on the signal output side with respect to the region 27.

In the above-described surge absorbing circuit SA5, the first conductor 11 includes the region 83 and the second portion 25 of the second conductor 21 the region 85. The region 83 of the first conductor 11 and the region 85 of the second portion 25 are located so as to overlap each other when viewed from the stack direction of the insulating layers 101, 102. The region 83 and the region 85 overlap each other with the insulating layer 101 in between to constitute a capacitor part 81 having a capacitance component. Therefore, an equivalent circuit configuration of the surge absorbing circuit SA5 is the same as that of the surge absorbing circuit SA4 shown in FIGS. 7 and 8.

As described above, the surge absorbing circuit SA5 can serve as a surge absorbing circuit that protects a semiconductor device or the like from static electricity of high voltage and that achieves better impedance matching for high-speed signals as well, as the surge absorbing circuit SA4 can.

Since the surge absorbing circuit SA5 has the capacitor part 81, it permits the induction coefficient of the first conductor 11 and the second conductor 21 and the capacitance of the capacitor part 81 to be flexibly set relative to the stray capacitance component of the surge absorber 3.

In the surge absorbing circuit SA5 the capacitor part 81 is comprised of the region 83 and the region 85. This simplifies the configuration of the surge absorbing circuit SA5 and achieves downsizing thereof, without need for separately providing a capacitor element.

Figure 11:
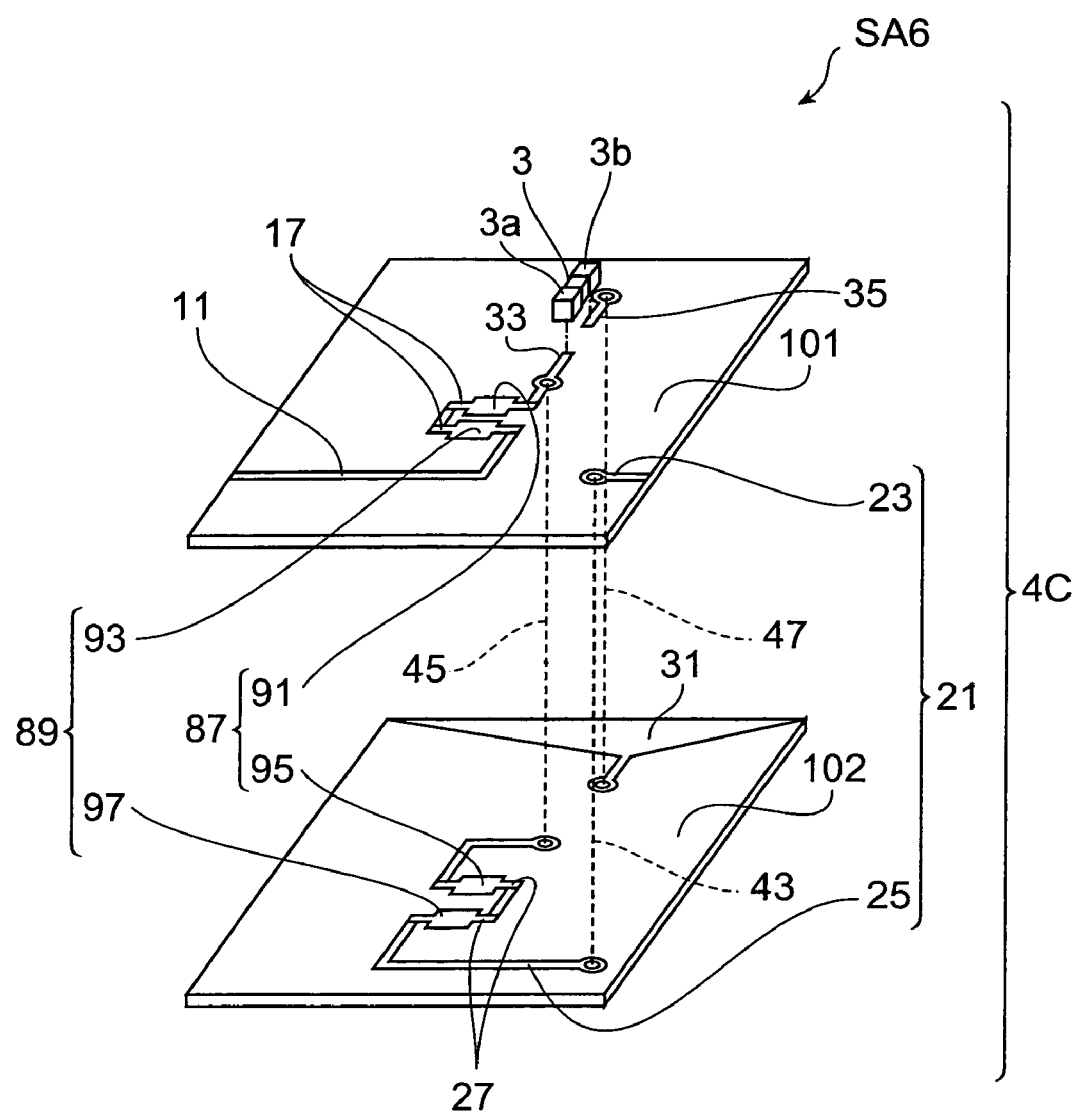
FIG. 11 is an exploded perspective view for explaining a configuration of a surge absorbing circuit which is a second modification example of the second embodiment.

Next, the second modification example of the surge absorbing circuit SA4 according to the second embodiment will be described with reference to FIG. 11. FIG. 11 is an exploded perspective view for explaining a configuration of the surge absorbing circuit SA6 being the second modification example of the second embodiment. The surge absorbing circuit SA6 has a multilayer circuit substrate 4C on which predetermined circuit patterns are formed, and a surge absorber 3 as the aforementioned surge absorbing circuit SA5 did. The circuit substrate 4C is provided with a first conductor 11, a second conductor 21, a third conductor 31, a first land 33, and a second land 35 arranged thereon, as the circuit substrate 4B was. The surge absorber 3 is mounted at a predetermined position on the circuit substrate 4C. The second conductor 21 includes a first portion 23 and a second portion 25. The surge absorbing circuit SA6 has two capacitor parts 87, 89 comprised of regions 91, 93 included in the first conductor 11 and regions 95, 97 included in the second portion 25 of the second conductor 21, as the surge absorbing circuit SA5 had one.

The first conductor 11, the first land 33, the first portion 23 of the second conductor 21, and the second land 35 are placed on the insulating layer 101. The first conductor 11 and the first land 33 are formed integrally with each other to constitute one conductor group. This conductor group is electrically isolated from the first portion 23 of the second conductor 21 and the second land 35. The first conductor 11 is of a meander shape. The first conductor 11 includes the region 91 and region 93. The region 91 and region 93 are wider than the regions other than the regions 91, 93 of the first conductor 11. The insulating layer 101 is provided with a through-hole conductor 45 penetrating the insulating layer 101 in the thickness direction thereof, at a position corresponding to an end of the first conductor 11 on the first land 33 side. The through-hole conductor 45 is electrically connected to the first conductor 11 and the first land 33.

The insulating layer 101 is also provided with a through-hole conductor 43 penetrating the insulating layer 101 in the thickness direction thereof. The through-hole conductor 43 is electrically connected to the first portion 23.

The surge absorber 3 is placed on the insulating layer 101. The first terminal 3a of the surge absorber 3 is physically and electrically connected to the first land 33. The second terminal 3b of the surge absorber 3 is physically and electrically connected to the second land 35. The insulating layer 101 is provided with a through-hole conductor 47 penetrating the insulating layer 101 in the thickness direction thereof, at a position corresponding to an end of the second land 35. The through-hole conductor 47 is electrically connected to the second land 35.

The second portion 25 of the second conductor 21, and the third conductor 31 are placed on the insulating layer 102. The second portion 25 is of a meander shape, corresponding to the first conductor 11. The second portion 25 of the second conductor 21 includes the region 95 located corresponding to the region 91 of the first conductor 11, and the region 97 located corresponding to the region 93 of the first conductor 11. The region 95 and region 97 are wider than the regions other than the regions 95, 97 in the second portion 25 of the second conductor 21.

One end of the second portion 25 of the second conductor 21 is located corresponding to the through-hole conductor 43, and is electrically connected to the through-hole conductor 43 in the state in which the insulating layer 101 and the insulating layer 102 are stacked. Therefore, the first portion 23 and the second portion 25 are electrically connected through the through-hole conductor 43. The other end of the second portion 25 is located corresponding to the through-hole conductor 45 and is electrically connected to the through-hole conductor 45 in the state in which the insulating layer 101 and the insulating layer 102 are stacked. Therefore, the first conductor 11 and the second portion 25 are electrically connected through the through-hole conductor 45. The second portion 25 and the surge absorber 3 are electrically connected through the through-hole conductor 45 and the first land 33.

The third conductor 31 has a region located corresponding to the through-hole conductor 47 and is electrically connected to the through-hole conductor 47 in the state in which the insulating layer 101 and the insulating layer 102 are stacked. This causes the third conductor 31 and the surge absorber 3 to be electrically connected through the through-hole conductor 47 and the second land 35.

In the above-described surge absorbing circuit SA6, the first conductor 11, and the second portion 25 of the second conductor 21 also include their respective regions 17, 27 mutually coupled in a polarity-reversed relation. The region 17 of the first conductor 11 and the region 27 of the second portion 25 are located so a to overlap each other when viewed from the stack direction of the insulating layers 101, 102.

In the surge absorbing circuit SA6 the first conductor 11 includes the region 91 and region 93, and the second portion 25 of the second conductor 21 includes the region 95 and region 97. The region 91 of the first conductor 11 and the region 95 of the second portion 25 are located so as to overlap each other when viewed from the stack direction of the insulating layers 101, 102. The region 93 of the first conductor 11 and the region 97 of the second portion 25 are located so as to overlap each other when viewed from the stack direction of the insulating layers 101, 102. The region 91 and region 95 overlap each other with the insulating layer 101 in between to constitute a capacitor part 87 having a capacitance component. The region 93 and region 97 overlap each other with the insulating layer 101 in between to constitute a capacitor part 89 having a capacitance component. Therefore, an equivalent circuit configuration of the surge absorbing circuit SA6 is the same as that of the surge absorbing circuits SA4, SA5 shown in FIGS. 7 and 8.

As described above, the surge absorbing circuit SA6 can serve as a surge absorbing circuit that protects a semiconductor device or the like from static electricity of high voltage and that achieves better impedance matching for high-speed signals as well, as the aforementioned surge absorbing circuit SA4 can.

Since the surge absorbing circuit SA6 has the capacitor parts 87, 89, it permits the induction coefficient of the first conductor 11 and the second conductor 21 and the capacitance of the capacitor parts 87, 89 to be flexibly set relative to the stray capacitance component 73 of the surge absorber 3.

In the surge absorbing circuit SA6 the regions 91, 93, 95, 97 constitute the capacitor parts 87, 89. This simplifies the configuration of the surge absorbing circuit SA6 and achieves downsizing thereof, without need for separately providing a capacitor element.

Figure 12:
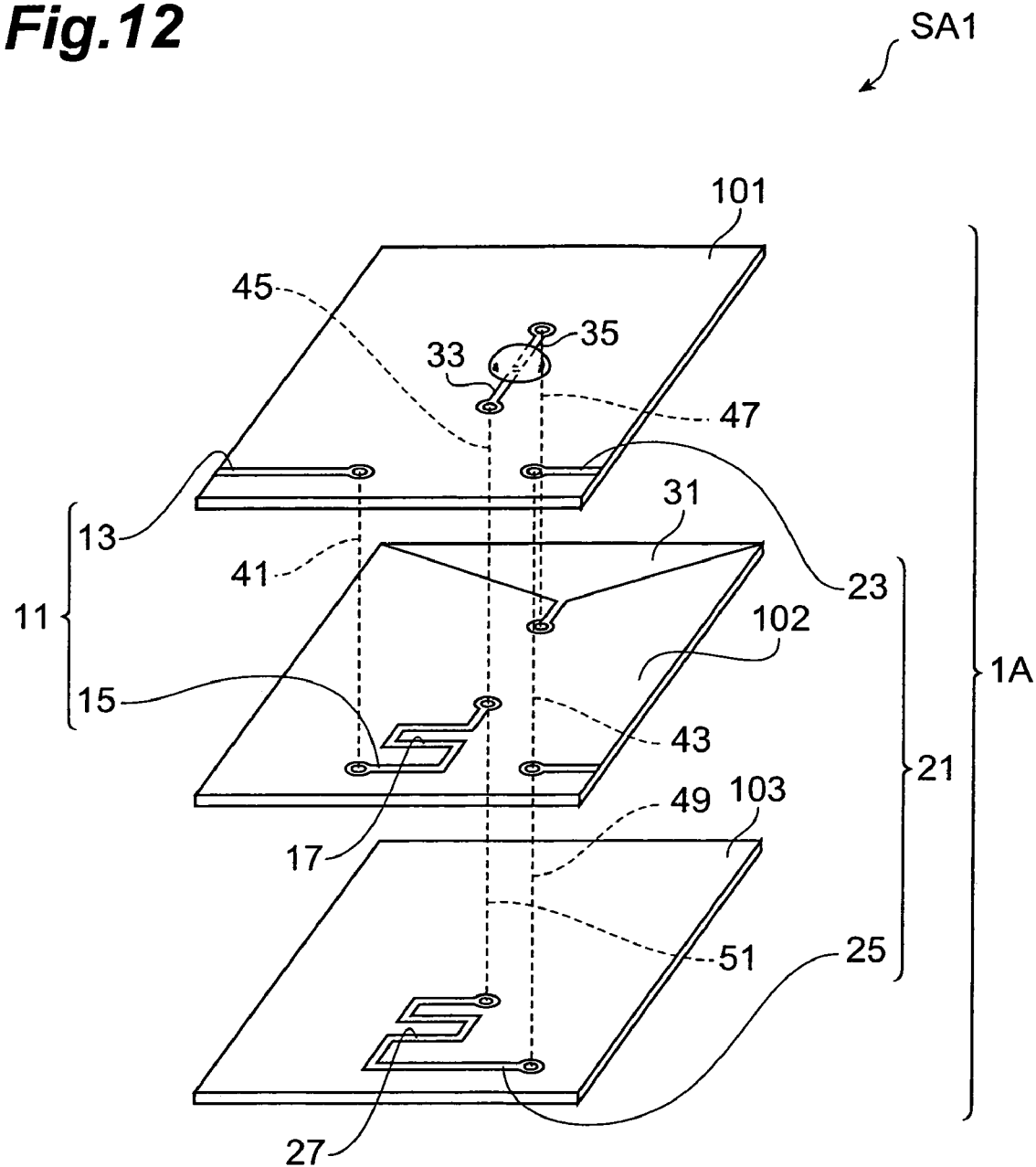
FIG. 12 is an exploded perspective view for explaining a configuration of a surge absorbing circuit which is a modification example of the first embodiment.

The above described the preferred embodiments of the present invention, but it is noted that the present invention is by no means limited to the above-described embodiments but can be modified in various ways without departing from the spirit and scope of the invention. For example, the patterns of the conductors formed on the insulating layers can be arbitrarily changed in their pattern and formation locations as long as the aforementioned equivalent circuit can be constructed. The surge absorber 3 may be a Zener diode, a gap discharge element (see FIG. 12), a silicon surge clamper, or the like instead of the multilayer chip varistor.

The invention claimed is:

1. A surge absorbing circuit comprising:
    a substrate on which a first conductor, a second conductor, and a third conductor are placed; and
    a surge absorber having a first terminal and a second terminal,
    wherein the first conductor and the second conductor are mutually coupled in a polarity-reversed relation, and one end of the first conductor is connected to one end of the second conductor,
    wherein the third conductor is electrically isolated from the first conductor and the second conductor on the substrate,
    wherein the first terminal of the surge absorber is connected to a connection portion between the first conductor and the second conductor, and the second terminal of the surge absorber is connected to the third conductor, and
    wherein an inductance component of the first conductor is placed substantially entirely on a layer of the substrate and an inductance component of the second conductor is placed substantially entirely on a different layer of the substrate.

2. The surge absorbing circuit according to claim 1, wherein the first conductor and the second conductor are placed on different layers so that at least partial regions of the first conductor and the second conductor overlap each other, and said mutually overlapping regions of the first conductor and the second conductor constitute a capacitance component.

3. The surge absorbing circuit according to claim 2, wherein the mutually overlapping regions of the first conductor and the second conductor are wider than regions of the first conductor and the second conductor that do not overlap.

4. The surge absorbing circuit according to claim 1, wherein the surge absorber is a multilayer chip varistor.

5. The surge absorbing circuit according to claim 4, wherein the first conductor and a portion of the second conductor coupled with the first conductor in a polarity-reversed relation are placed on different layers so that at least partial regions of the first conductor and the second conductor overlap each other, and said mutually overlapping regions of the first conductor and the second conductor constitute a capacitance component.

6. The surge absorbing circuit according to claim 5, wherein the mutually overlapping regions of the first conductor and the second conductor are wider than regions of the first conductor and the second conductor that do not overlap.

7. The surge absorbing circuit according to claim 1, wherein a signal is inputted into the first conductor and a signal is outputted from the second conductor, and wherein the first conductor and the second conductor are positively coupled.

8. The surge absorbing circuit according to claim 1, wherein an input impedance Zin, a characteristic impedance Zo, an induction coefficient Lz of the first and second conductor, a coupling coefficient Kz between the first and second conductor, an angular frequency ω, and a capacitance Cz of a stray capacitance component of the surfacing absorber satisfy the equations:

$$Zin = \sqrt{\frac{2(1+Kz)Lz}{Cz} + \omega^2 Lz^2(Kz^2 - 1)}$$

and $$Lz = \frac{Zo^2 Cz}{4},$$

whereby the input impedance is matched with the characteristic impedance.

9. The surge absorbing circuit according to claim 1, further comprising a capacitance component connected between the first and second conductor, wherein an input impedance Zin, a characteristic impedance Zo, an induction coefficient Lz of the first and second conductor, a coupling coefficient Kz between the first and second conductor, a capacitance Cz of a stray capacitance component of the surge absorber, an angular frequency ω, and a capacitance Cs of the capacitance component satisfy the equations:

$$Zin = \sqrt{\frac{2(1+Kz)Lz}{Cz} \cdot \frac{1 - \omega^2 Lz((1-Kz)Cs/2)}{1 - \omega^2 Lz(2(1+Kz)(Cs)}},$$

$$Cs = \frac{1 - Kz}{4(1+Kz)} Cz,$$

and $$Lz = \frac{Zo^2 Cz}{2(1+Kz)},$$

whereby the input impedance is matched with the characteristic impedance.

10. The surge absorbing circuit according to claim 9, wherein the induction coefficient Lz, the coupling coefficient Kz, the capacitance Cz, the capacitance Cs, and an induction coefficient Le of the stray inductance component of the surge absorber further satisfy the equation:

$$Cs = \frac{1 - Kz + 2Le/Lz}{4(1+Kz)} Cz,$$

whereby the input impedance is matched with the characteristic impedance.

* * * * *